(12) United States Patent
Rau

(10) Patent No.: US 6,191,639 B1
(45) Date of Patent: Feb. 20, 2001

(54) GATING CIRCUIT FOR ANALOG VALUES

(75) Inventor: Ernst Rau, Bad Krozingen (DE)

(73) Assignee: Litef GmbH (DE)

( * ) Notice: Under 35 U.S.C. 154(b), the term of this patent shall be extended for 0 days.

(21) Appl. No.: 09/402,203

(22) PCT Filed: Jan. 12, 1999

(86) PCT No.: PCT/EP99/00122

§ 371 Date: Sep. 30, 1999

§ 102(e) Date: Sep. 30, 1999

(87) PCT Pub. No.: WO99/39353

PCT Pub. Date: Aug. 5, 1999

(30) Foreign Application Priority Data

Jan. 30, 1998 (DE) .............................................. 198 03 722

(51) Int. Cl.[7] .......................... H03K 17/16; H03K 17/30
(52) U.S. Cl. .............................. 327/379; 327/94; 327/560
(58) Field of Search ................................... 327/311, 379, 327/380, 381, 384, 387, 388, 560, 561, 563, 94, 96

(56) References Cited

U.S. PATENT DOCUMENTS 4,404,479  9/1983  Toyomaki ............................. 327/95
5,479,121  12/1995  Shen et al. ............................ 327/94
5,606,277 *  2/1997  Feliz ................................... 327/311
5,774,021 *  6/1998  Szepesl et al. ...................... 330/257

FOREIGN PATENT DOCUMENTS 0831495  3/1998  (EP) .
2108343  5/1983  (GB) .

\* cited by examiner

Primary Examiner—Terry Cunningham
Assistant Examiner—Quan Tra
(74) Attorney, Agent, or Firm—Elliott N. Kramsky

(57) ABSTRACT

A gating circuit for largely glitch-free gating of analog signal values obtained in a periodic sequence, capacitively buffer-stored, digitized by means of an A/D converter and subsequently erased before a next signal value is obtained in the capacitive buffer store. A first operational transconductance amplifier (OTA) capable of being activated by a gating pulse has a non-inverting input connected to the reference-earth point of a capacitive store and an output connected to the charging terminal of the capacitive store. Its inverting input is connected through an impedance converter and a resistor, which limits the discharge current, to the charging terminal of the capacitive store. A second OTA serves as a signal driver whose gain is predetermined by the ratio of the value of a resistor connected in parallel with the capacitive store to that of a series resistor that determines the potential at the inverting input of the second OTA.

1 Claim, 2 Drawing Sheets

GATING CIRCUIT FOR ANALOG VALUES

BACKGROUND

1. Field of the Invention

The present invention relates to gating circuits. More particularly, this invention pertains to a gating circuit for analog values obtained in a predetermined sequence, capacitively buffer-stored, digitized by means of an A/D converter and subsequently erased, by discharge of the capacitive store within a time interval that is predetermined by a gating pulse, before the next analog signal is obtained.

2. Describing the Prior Art

Many measured-value processing circuits obtain an analog measured or signal value in a specific (e.g. periodic) sequence that is cumulatively stored or buffer-stored during a specific period of time and then subject to analog/digital conversion for further processing as a digital value. An example of a measurement system of this type, with either open or closed control loop, is the fiber-optic gyro (FOG), the fundamental structure of which is illustrated in FIG. 4. In such a device, light from a light source 30 is directed, via an optical waveguide, to a coupler 31 (e.g. a 2×2 coupler). The coupled signal propagates in the opposite direction, via another optical waveguide, to a photosensitive detector 34. Proceeding in the forward direction, a polarizer and a beamsplitter are connected to an output of the coupler 31 via still another optical waveguide designed, for example, as a space domain filter with polarizer and beam-splitter combined in a multifunctional integrated optical chip (MIOC) 32. In such a case, a phase modulator can also be integrated within the MIOC 32. Incoming light is split into two approximate halves in the beamsplitter of the MIOC 32. As a result, two partial waves penetrate in opposite directions an optical waveguide in the form of a fiber coil 33 connected to the two outputs of the MIOC 32. After passing through the coil 33, the partial waves are reunited in the beamsplitter of the MIOC 32, then pass through the polarizer and the above-mentioned space domain filter to the coupler 31. From there they pass to the detector 34, whose output signal, in the downstream signal processing path, is initially amplified in an amplifier 4 and then cumulatively stored in a capacitive store that may be part of a low-pass filter. In this way, the output signal can be subsequently subjected to analog/digital conversion as a momentarily cumulated signal value by an A/D converter 5. Digital values from the A/D converter 5 are fed to a digital signal evaluation and control circuit 35. In the case of a FOG with a closed control loop, analog resetting is affected in the MIOC 32 via an A/D converter 36. At approximately the same time, the digital evaluation and control circuit 35 supplies a gating pulse whose function will be discussed below (in connection with FIGS. 2 and 3).

In the case of the measuring device described with reference to FIG. 4, gating is done to generate the signal value (generated during a measurement cycle or loop) after the A/D conversion with as few glitches as possible. That is, with as few as possible voltage spikes being produced by the gating operation and capable, on average, of shifting the start value of the A/D converter. Difficulties, described with reference to FIG. 2, illustrating a solution of the prior art, arise in this process.

Referring to FIG. 2, a circuit schematic of a gating circuit for minimizing glitches when generating a signal value after A/D conversion in accordance with the prior art, the signal from the amplifier 4 passes to the input of the A/D converter 5 via a low-pass filter comprising a resistor 1 and a capacitor 2. The upper signal profile illustrated in FIG. 3 shows, at the left hand part, the profile of potential that builds up at point A. The cumulated signal value is applied to the input of the A/D converter 5 within a specific time slot designated by the signal STARTCONVERT 37. After A/D conversion, a switch 3 (governed by a gating pulse at 9) that bridges the capacitor 2 is closed. As a result, all information from the relevant loop is erased in the capacitor 2. At the reference-earth point of the capacitive store (i.e. of the capacitor 2) a DC voltage required for the A/D converter 5 is set by means of a buffer 6 and RC elements 7 and 8.

The circuit described thus far with reference to FIG. 2 faces a crucial problem. Under specific boundary conditions, the amplitude of the gating pulse at the terminal 9 must reach a considerable value (e.g. up to 12 V) to be capable of reliably short-circuiting the capacitor 2. This is not consistent with supplying the circuit with just 5 V. The reasons for this can be found in the required offset for the A/D converter 5 and in the level of the gate voltage for the FETs in the switch 3 for reliable and low-impedance switching. Due to the gating caused by the gating pulse at 9, the signal profile at point A exhibits overshoots (i.e. the above-mentioned glitch) that can cause the above-mentioned undesirable shift of the start value of the next respective A/D conversion, in some instances as a function of the respective preceding signal value. Bipolar transistors, triggered by their base currents, would build an additional DC voltage potential across the capacitor 2, bringing about the same effect as signal overshoots.

SUMMARY AND OBJECTS OF THE INVENTION

It is therefore an object of the present invention to provide a gating circuit for a measured value processing circuit which avoids problems associated with the gating operation concerning overshoots or glitches onto subsequent A/D conversions.

It is a further object of the invention to provide a gating circuit for a measured value processing circuit in which it is possible to approach a voltage near the supply voltage with the signals to be gated without any particular requirements on gating pulse amplitude.

The present invention addresses the preceding and other objects by providing an improvement in a gating circuit for analog signal values obtained in a periodic sequence, capacitively buffer-stored, digitized by an A/D converter and subsequently erased, before a next analog signal value is obtained, by discharge of the capacitive store within a time interval that is predetermined by a gating pulse. The improvement provided by the invention to such a gating circuit includes a first operational transconductance amplifier which can be activated by the gating pulse.

A non-inverting input of the first amplifier is connected to a reference-earth point of the capacitive store and its output is connected to a charging terminal of the capacitive store. An inverting input of the first amplifier is connected through an impedance converter and a discharge-current variable resistor to the charging terminal of the capacitive store.

A second operational transconductance amplifier is provided through which the analog signal values pass to the charging terminal of the capacitive store. The gain of the second amplifier is predetermined by the ratio of a resistor, connected in parallel with the capacitive store, to a series resistor that determines the potential at the inverting input of the second amplifier.

The preceding and other features and advantages of this invention will become further apparent from the detailed

BRIEF DESCRIPTION OF THE DRAWING FIGURES

Figure 2:
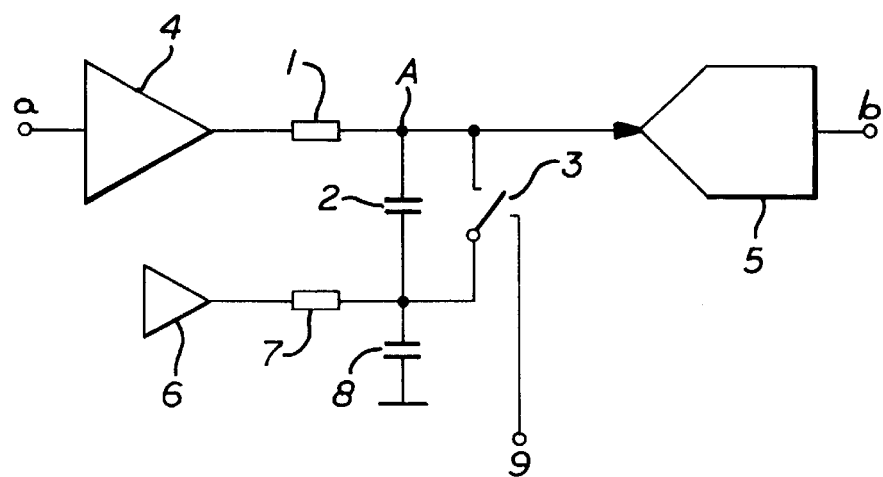
FIG. 2 is a circuit schematic of a gating circuit for minimizing glitches when generating a signal value after A/D conversion in accordance with the prior art.
Figure 3:
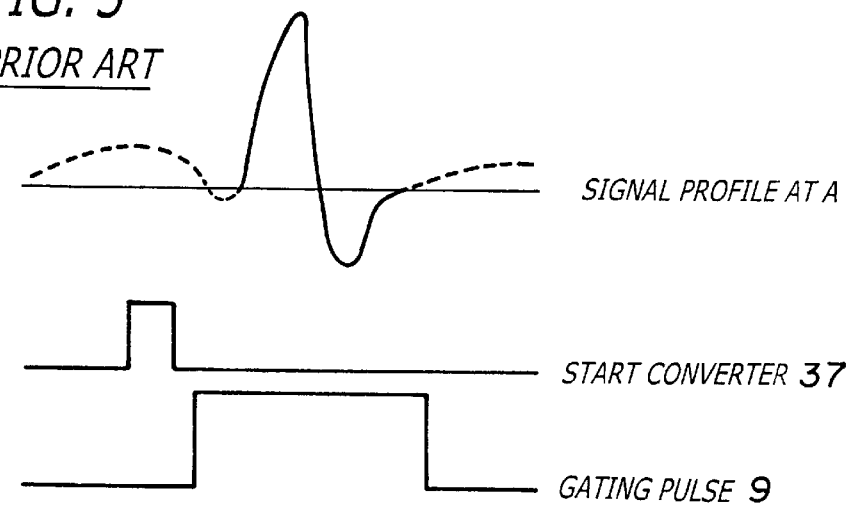
Figure 4:
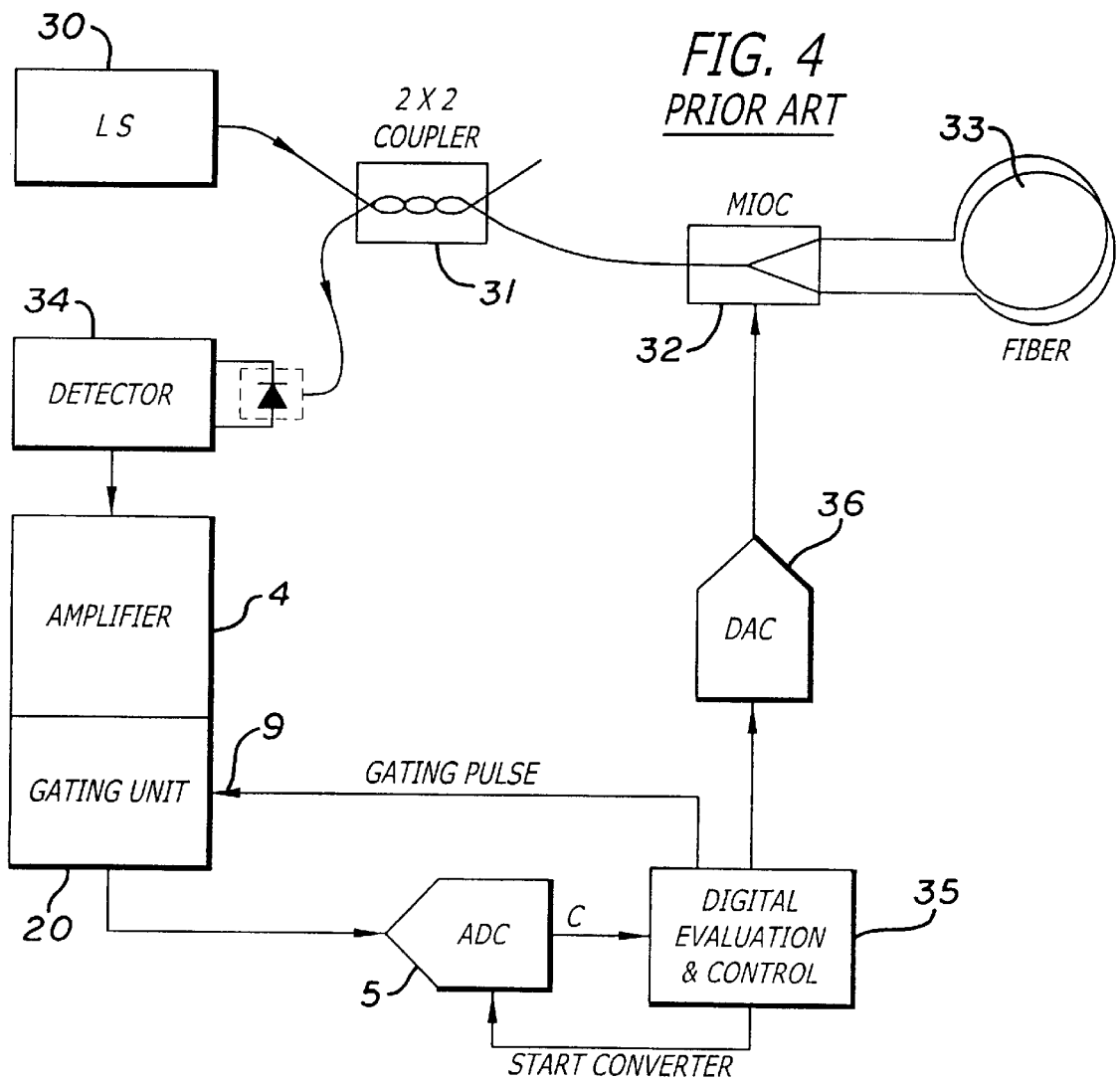

FIG. 3 illustrates the time profile of the potential that builds up at point A of the prior art circuit illustrated in FIG. 2 (top diagram), a STARTCONVERT signal defining the time slot during which the cumulated signal value is applied to the input of the A/D converter (middle diagram) and the gating pulse (bottom diagram); and FIG. 4 is a block diagram of a fiber optic gyro employing a gating circuit.

DETAILED DESCRIPTION OF THE PREFERRED EMBODIMENT

Figure 1:
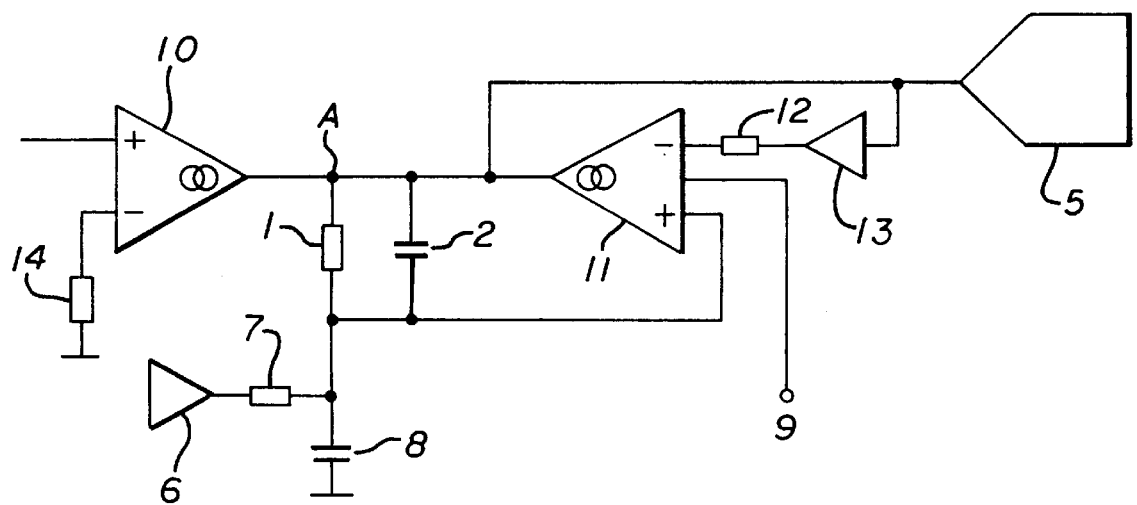
FIG. 1 is a circuit schematic of a gating circuit in accordance with the invention.

Turning to the drawings, FIG. 1 is a circuit schematic diagram of a gating circuit in accordance with the invention. A second operational transconductance amplifier (OTA) 10 serves as the signal driver of the circuit for impressing a current proportional to the input voltage at its inverting input and a series resistor 14 connected to reference-earth potential and into the low-pass filter connected on its output side. The low-pass filter comprises the parallel circuit formed by a resistor 1 (corresponding to the like referenced resistor of FIG. 2), and a capacitor 2 that serves as a capacitive cumulative store. The ratio of the values of the resistor 1 to the series resistor 14 determines the present gain of the signal driver stage. The voltage building up at the charging terminal A (i.e. across the resistor 1) and across the capacitor 2 is converted into a digital signal at the A/D converter 5. The capacitor 2 is subsequently discharged by the gating circuit of the invention as follows: a first OTA 11, which does not function during the charging operation (it is inhibited), is activated by the gating pulse at 9 to drive a current into the capacitor 2 until the same potential prevails at its two terminals. In such case, the maximum charge-reversal current is determined by a resistor connected to the inverting input of the first OTA 11 and the charging voltage across the capacitor 2. Adaptation to the cycle or loop time and minimal switching spikes or overshoots are achieved by suitable choice of the value of the resistor 12. The terminal of the resistor 12 remote from the inverting input at the first OTA 11 is connected through an impedance converter 13 to the charging terminal and to the input of the A/D converter 5. The function of the buffer 6 with the RC elements 7 and 8 is the same as that described above with reference to the gating circuit of FIG. 2.

The particular advantage of the gating circuit of the invention is, on the one hand, the possibility of approaching virtually the level of the supply voltage with the signals to be gated. This applies even when just a single supply source is present. On the other hand, switching spikes (i.e. overshoots or glitches) are minimized by an adapted discharge current for the now virtually ideal low-pass filter.

While this invention has been described with reference to its presently-preferred embodiment, it is not limited thereto. Rather, the invention is only limited insofar as it is described in the following set of patent claims and includes within its scope all equivalents thereof.

What is claimed is:

1. In a gating circuit for analog signal values obtained in a periodic sequence, capacitively buffer-stored, digitized by an A/D converter and subsequently erased, before a next analog signal value is obtained, by discharge of said capacitive store within a time interval that is predetermined by a gating pulse, the improvement comprising, in combination:
   a) a first operational transconductance amplifier that can be activated by said gating pulse;
   b) a non-inverting input of said transconductance amplifier being connected to a reference-earth point of said capacitive store and the output of said amplifier being connected to a charging terminal of said capacitive store;
   c) an inverting input of said amplifier being connected through an impedance converter and a discharge-current variable resistor to said charging terminal of said capacitive store;
   d) a second operational transconductance amplifier through which said analog signal values pass to said charging terminal of said capacitive store; and
   e) the gain of said second amplifier being the ratio of the value of a resistor connected in parallel with said capacitive store to that of a series resistor that determines the potential at the inverting input of said second amplifier.

* * * * *